United States Patent [19]

Rille et al.

[11] Patent Number: 4,668,373
[45] Date of Patent: May 26, 1987

[54] TARGET PLATE FOR CATHODE SPUTTERING

[75] Inventors: Eduard Rille, Dornbirn, Austria; Erich Kaiser, Vaduz, Liechtenstein; Pius Grünenfelder, Buelweg, Switzerland

[73] Assignee: Balzers AG, Liechtenstein

[21] Appl. No.: 756,050

[22] Filed: Jul. 17, 1985

[30] Foreign Application Priority Data

Jul. 20, 1984 [CH] Switzerland ............... 3545/84

[51] Int. Cl.$^4$ ............................................. C23C 14/00
[52] U.S. Cl. ................................. 204/298; 204/192.1
[58] Field of Search ............... 204/298, 192 R, 192.1, 204/192.12; 269/47

[56] References Cited

U.S. PATENT DOCUMENTS

| 3,595,775 | 7/1971 | Grantham et al. | 204/298 |
| 3,838,031 | 9/1974 | Snaper | 204/298 X |
| 4,448,653 | 5/1984 | Wegmann | 204/298 |
| 4,517,070 | 5/1985 | Kisner | 204/298 |
| 4,556,471 | 12/1985 | Bergman et al. | 204/298 |

FOREIGN PATENT DOCUMENTS 138081 10/1979 Fed. Rep. of Germany ...... 204/298

Primary Examiner—John F. Niebling
Assistant Examiner—Nam X. Nguyen
Attorney, Agent, or Firm—McGlew and Tuttle

[57] ABSTRACT

In conventional attachments of target plates for cathode sputtering the danger always existed that they will become plastically deformed at the operating temperature and detach from a cooling support. For secure attachment without fastening means on the front side to be disintegrated, the target plate according to the invention presents on its back a cutout (4) in which there is inserted by means of a mechanical spring union, e.g. by means of a lock ring (8), an auxiliary body (6) of a material of higher strength and higher softening point than the material to be disintegrated, which body has a threaded bore (12) for attachment of the target plate on a support (1).

9 Claims, 1 Drawing Figure

TARGET PLATE FOR CATHODE SPUTTERING

FIELD AND BACKGROUND OF THE INVENTION

The present invention relates in general to cathode sputtering equipment and in partiular to a new and useful target plate therefore.

Target plates for cathode sputtering consists of a material which is to be disintegrated in a cathode sputtering apparatus in order to precipitate on substrate surfaces a layer of the respective material or, in the presence of a chemically active residual gas in the sputtering apparatus, a chemical compound of the target material with an active gas.

In installations of relatively high power, the cathode plates are often exposed to a very high thermal load due to bombardment with ions and must be cooled to remove the excess thermal energy. Nevertheless, at high power the problem arises that when the target plates are rigidly clamped at their rim, as usual, while being pressed against a cooled support, they warp as a result of thermal expansion and will then lift off the support, causing the cooling to become insufficient and the target material to assume too high a temperature. It will then soften and may possibly even melt in the end. To prevent this, it has been tried to solder or weld the back of the target plate to the cooled support. Such a union had to be made extremely carefully, however, as otherwise the target plate could become detached from the support nevertheless. At any rate, this soldering on or welding is laborious. Usually the edge of the target plate was screwed tight on the cooled support, and also in the center of the plate a screw attachment was provided to prevent it from lifting off. Also there has been proposed a target plate with several cutouts along a parallel center line of the surface to be disintegrated, these cutouts being disposed in the bottom of a groove applied on the side of the surface to be disintegrated, along the center line, and the groove depth is dimensioned so that a bar inserted in the groove for the attachment of the target plate and the respective attachment screws do not protrude over the disintegration plane.

Owing to the thinness of the target plate in the area of the groove bottom in the center of the plate, where in earlier arrangements usually the highest temperature occurred during the sputtering, improved cooling was achieved at this point, thus preventing the material from warping or flowing in the regioin of the center attachment. The need for an attachment bar on the front of the target plate, that is, on the surface to be disintegrated, still constituted a disadvantage, however, in particular if even the least concomitant disintegration of the material (steel) of which the central attachment bar and the attachment screws were made, impermissibly contaminates the layers to be produced.

SUMMARY OF THE INVENTION

By comparison, the present invention is intended to indicate a construction of a target plate where the front side is free from attachment means, excepting any holding bars that may be provided at its outermost edge.

The problem is solved by a target plate which is characterized in that on its side away from the surface to be disintegrated it has at least one cutout or recess into which an auxiliary body for attachment to a support is inserted by means of a mechanical spring connection.

Spring connections per se are, of course, known in machine construction, but it had not been realized that with such a specific connection at the same time a solution of all problems with target plates for sputtering operations could, surprisingly, be achieved.

The mentioned cutout in the target plate may in particular be a hollow cylindrical recess, a cylindrical auxiliary body being inserted in the cutout by means of a lock ring. To obtain sufficient mechanical stability also at relatively high operating temperatures, the auxiliary body is to consist of a material which has a much higher softening point than the material to be disintegrated. Advantageously the cylindrical auxiliary body is made to apply by its one lateral face closely against the flat bottom of the cotout, while the other lateral face is flush with the back of the target plate away from the side to be disintegrated. To achieve optimum heat removal, it is further advantageous if the auxiliary body consists of a material of higher thermal conductivity than that of the material to be disintegrated.

Accordingly a further object of the invention is to provide a target plate which is simple in design, rugged in construction and economical to manufacture.

A still further object of the invention is to provide a method of connecting a target member of a target plate to a cooling support for the member, utilizing a recess on a lower surface of the target plate which receives an auxiliary body which is fixed to the support and which is connected to the target member through a spring biasing connection.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWING

The only FIGURE.

DESCRIPTION OF THE PREFERRED EMBODIMENT

Figure 1:
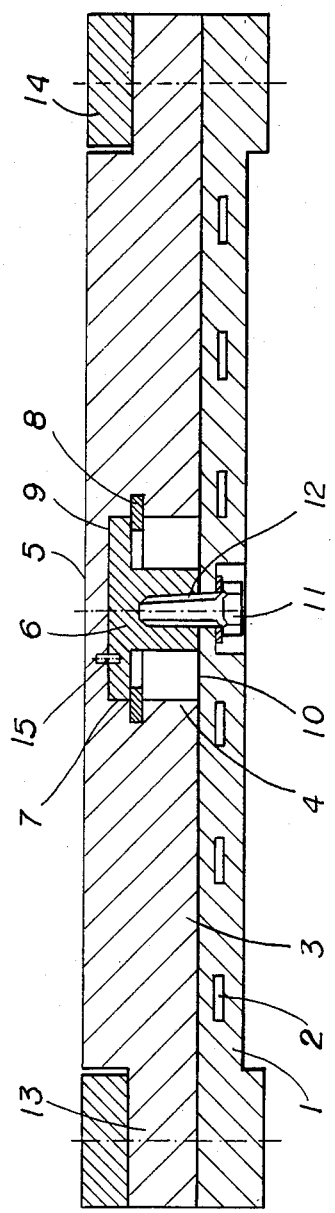
FIG. 1, is a side sectional view of a target plate in accordance with the present invention.

The attached drawing shows an embodiment of the invention. In it, 1 denotes a target plate support, provided with cooling bores 2. The target plate consists of a main body 3 of the material to be disintegrated, having a cylindrical cutout or recess 4 on the back of the target plate away from the surface 5 to be disintegrated. In cutout 4, a cylindrical auxiliary body 6 with a shoulder 7 is inserted and mechanically locked by means of a lock ring 8 (e.g. a split spring clip in annular grooves of the body 6 and recess 4). The auxiliary body applies by one of its flat end faces against the flat bottom 9 of cutout 4 for good thermal conduction and by its other end face it is flush with the flat back of the target plate. This end face and said back apply against the flat surface 10 of the coolable support snugly and hence likewise with good heat contact. The auxiliary body is attached to the support by means of a screw 11 which engages in the central threaded bore 12 of the auxiliary body. In addition, the target plate has along its edge or circumference a shoulder 13 and is additionally screwed to the support by means of a ring 14 in a manner known in itself, as the drawing shows. Body 3 may for example be cylindrical.

Naturally it is possible also to form on the back of the target plate several cutouts with an auxiliary body inserted on them for mechanically locking and thus to provide several attachment points according to the invention. This may be desirable especially for target plates of relatively large dimensions.

Advantageously the auxiliary body 6 consists of a material of good thermal conductivity and therefore is formed e.g. as a copper block.

To prevent the auxiliary body from turning in the cutout when being screwd to the support, a bolt 15 engaging in a corresponding bore of the auxiliary body may be provided, as the drawing indicates.

It is readily clear to the specialist that the basic principle of the present invention, to connect target plates by so-called spring unions mechanically locking with an auxiliary body which then in turn can be firmly connected with a support and which also assures good heat transfer, can be modified in many ways. The inserted auxiliary bodies do not have to be cylindrical and there are a number of additional mechanically locking spring unions which are suitable for solving the problem for the invention.

While a specific embodiment of the invention has been shown and described in detail to illustrate the application of the principles of the invention, it will be understood that the invention may be embodied otherwise without departing from such principles.

What is claimed is:

1. A target plate for cathode sputtering comprising a plate member (3) having a first surface (5) to be disintegrated and a second surface opposite said first surface with at least one cut-out area (4) therein, an auxiliary body of good thermally conductive material (6) in said cutout area, a support (1) engaged against said second surface and connected to said auxiliary body for supporting said plate member, and a spring connection means (8) connected between said auxiliary body and said plate member, said auxiliary body being provided with a threaded bore (12) for attachment to the support (1), said cutout area (4) being hollow and cylindrical, said auxiliary body (6) being cylindrical and said spring connection means comprising a lock ring (8) engaged around said auxiliary body and in said cutout area, said auxiliary body (6) consists of a material which has a higher softening point than material of said plate member (3) to be disintegrated, said auxiliary body (6) having a first face engaged closely against a flat bottom (9) of the cutout (4) and another face which is flush with the extending surface of the plate member, and an anti notation pin (15) extending into said auxiliary body and into said plate member at a location radially spaced from said threaded bore (12).

2. A target plate according to claim 1 wherein said auxiliary body has a shoulder (7) seated in said cylindrical cutout area (4), said cylindrical cutout area including an annular groove adjacent said shoulder, said lock ring (8) being engaged in said annular groove and against said shoulder for retaining said auxiliary body in said cutout.

3. A target plate according to claim 2 wherein the connection between said auxiliary body (6) and said support (1) comprises a bolt (11) extending through said support and being threaded into said threaded bore (12) of said auxiliary body (6).

4. A target plate assembly according to claim 1, wherein said cutout area is cylindrical, said auxiliary body having a cylindrical shoulder with a flat top surface opposite from said outer surface of said auxiliary body, said cutout area having a flat bottom surface mating with said flat top surface of said auxiliary body, said cutout area having an annular groove under said shoulder with respect to said flat bottom surface of said cutout area, said spring connection means comprising a spring ring disposed in said groove and engaged under said shoulder of said auxiliary body.

5. A target plate assembly according to claim 4, wherein said plate member has a shoulder in its first exposed surface at said edges thereof, a connecting element disposed on said shoulder and a connection means between said connecting element and said support plate for connecting said plate member at its edges to said support plate at locations spaced from said auxiliary body.

6. A target plate assembly according to claim 5, wherein said plate member is cylindrical, said shoulder of said plate member being cylindrical and said connecting element being in the form of a ring.

7. A target plate assembly according to claim 6, including a pin extending between said auxiliary body and said plate member preventing rotation of said auxiliary body in said cutout area of said plate member.

8. A target plate assembly according to claim 7, wherein said auxiliary body is made of material having a higher softening temperature than material of said plate member.

9. A target plate assembly for cathode sputtering comprising:
   a target body having a first surface exposed for disintegration of material of said target body, and a second opposite surface, said target body having outer edges with a recess in said opposite surface intermediate said edges;
   an auxiliary body made of material with good thermal conductivity disposed in said recess having an outer surface lying in a common plane with said second opposite surface of said target body;
   spring means connecting said auxiliary body with said target body;
   a support plate having a surface engaged against said second opposite surface of said target, said outer surface of said auxiliary body and overlying said recess;
   a connector fixedly connecting said auxiliary body to said support plate; and
   cooling means in said support plate for cooling said support plate.

* * * * *